(12) United States Patent
Zibert et al.

(10) Patent No.: US 6,208,562 B1
(45) Date of Patent: Mar. 27, 2001

(54) DIGITAL MEMORY AND METHOD OF OPERATION FOR A DIGITAL MEMORY

(75) Inventors: Martin Zibert, Feldkirchen-Westerham; Bret Johnson, München, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/536,029

(22) Filed: Mar. 27, 2000

Related U.S. Application Data

(63) Continuation of application No. PCT/DE98/02156, filed on Jul. 29, 1998.

(30) Foreign Application Priority Data

Sep. 26, 1997 (DE) .............................................. 197 42 597

(51) Int. Cl.[7] .................................................. G11C 7/00
(52) U.S. Cl. .................. 365/189.01; 365/189.05
(58) Field of Search ........................ 365/189.05, 189.01, 365/195, 200, 201

(56) References Cited

U.S. PATENT DOCUMENTS

| | | | |
|---|---|---|---|
| 4,766,570 | 8/1988 | Yamaguchi et al. | 365/189 |
| 5,255,271 | 10/1993 | Tatman et al. | 371/22.1 |
| 5,424,984 | * 6/1995 | Nagahama et al. | 365/189.05 |
| 5,444,661 | * 8/1995 | Matsui | 365/201 |
| 5,537,053 | 7/1996 | Sartwell et al. | 324/763 |

FOREIGN PATENT DOCUMENTS 0 471 540 A2   2/1992  (EP) .

* cited by examiner

*Primary Examiner*—Vu A. Le
(74) *Attorney, Agent, or Firm*—Herbert L. Lerner; Laurence A. Greenberg; Werner H. Stemer

(57) ABSTRACT

The digital memory has at least one data line and address lines. It also has a switching unit that, in an active state, inverts signals on the data line or on at least one of the address lines and that, in an inactive state, leaves the signals unchanged. In a first operating mode, the switching unit is in the same state for writing and reading. In a second operating mode, the switching unit is in respectively opposite states for writing and for reading.

4 Claims, 3 Drawing Sheets

DIGITAL MEMORY AND METHOD OF OPERATION FOR A DIGITAL MEMORY

CROSS-REFERENCE TO RELATED APPLICATION

This is a continuation of copending international application PCT/DE98/02156, filed Jul. 29, 1998, which designated the United States.

BACKGROUND OF THE INVENTION

Field of the Invention

The invention relates, in general, to a digital memory and to a method of operating a digital memory.

For dynamic memories (DRAMs), operating modes that can be stipulated by the memory manufacturer are based on a JEDEC standard. The JEDEC standard merely defines how to change from a normal operating mode to additional operating modes. Often, these additional operating modes are manufacturer-specific test operating modes. According to the JEDEC standard, a change into these additional operating modes can be performed by applying prescribed signal combinations to the standard external connections of the DRAM.

When a memory is operating, and particularly, when the memory is being tested, it is desirable to be able to establish whether an intentional change of operating modes has actually taken place, or whether an unintentional change has occurred by chance. However, the presented problem is that the number of external connections of a DRAM is limited, so that, under some circumstances, none of the connections can be used to output an appropriate status signal that can give information about the particular operating mode.

SUMMARY OF THE INVENTION

It is accordingly an object of the invention to provide an integrated memory and a corresponding method of operating the memory which overcomes the hereinafore-mentioned disadvantages of the heretofore-known methods and devices of this general type in such a way that different operating modes can be recognized from outside the memory without providing or using additional external connections.

With the foregoing and other objects in view there is provided, in accordance with the invention, a digital memory that has data lines for writing data to the memory and for reading data from the memory, and address lines for addressing the memory during reading and writing. It also has at least one switching unit which, in an active state, inverts signals on at least one of the data lines or on at least one of the address lines and which, in an inactive state, leaves the signals unchanged. In a first operating mode of the memory, the switching unit is in the same state (active or inactive) both for writing and for reading. In contrast, in a second operating mode, the switching unit is in respectively opposite states for writing and for reading.

Consequently, in the first operating mode, the memory behaves like a conventional memory, in which stored data is read in the same state as that with which it was written to the memory. As far as the second operating mode is concerned, two embodiments of the invention are distinguishable, which have no equivalents in conventional memories. In the first embodiment, the signal on one or more of the data lines is inverted only in the second operating mode either for writing or for reading. By comparing the written data with the read data it is then easy to establish, from outside the memory, which operating mode the memory is in.

In the second embodiment of the memory, the data on at least one of the address lines is inverted in the second operating mode either for writing or for reading. This means that, for writing and reading in the second operating mode, different memory cells of the memory are addressed in each case using the same external address. If mutually complementary data has previously been written to these different memory cells, it is again possible to detect a change to the second operating mode from outside the memory without any great complexity.

With the foregoing and other objects in view there is provided, in accordance with the invention, a method of operating a digital memory. In a first operating mode of the digital memory, when an address is applied during a read operation, data which has previously been written under this address is read with an unchanged logic state. In contrast, in a second operating mode, when an address is applied during a read operation, data is read which is the inverse of the data previously written under this external address.

According to a first embodiment of the method of operation, in the second operating mode, data is inverted either for writing or for reading.

According to a second embodiment of the method of operation, in the second operating mode, when an address is applied during a read operation, data is read from different memory cells than were previously addressed with this address for writing. In contrast, in the first operating mode, for writing and reading, the same address is used to address the same respective memory cells. In one development of this second embodiment of the method of operation, data having a first logic state is written to a first memory area of the memory, and data having a second logic state is written to a second memory area of the memory. Then, in the second operating mode, data is read from the second memory area during a read operation as a result of applying an address associated with the first memory area during a write operation. This achieves the effect that, in the second operating mode, data which is the inverse of that previously written to the memory under the same external address is read.

Other features which are considered as characteristic for the invention are set forth in the appended claims.

Although the invention is illustrated and described herein as embodied in a digital memory and method of operation for a digital memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
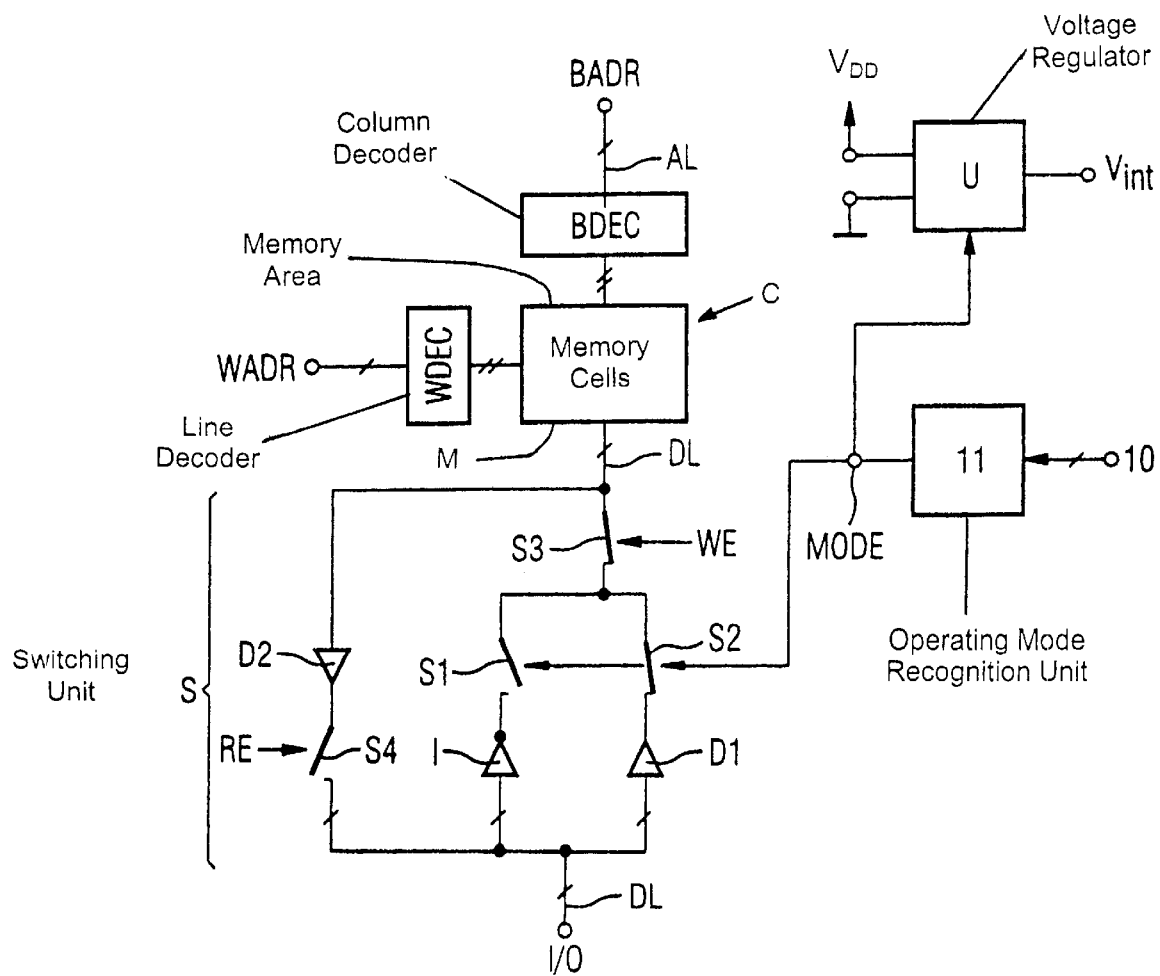
FIG. 1 shows a first illustrative embodiment of a digital memory.

Referring now to the figures of the drawing in detail, and first, particularly to FIG. 1 thereof, there is seen a first illustrative embodiment of the memory according to the invention. It is a DRAM. This has a memory area M with word and bit lines (not shown) that are configured in a matrix and that has memory cells C configured at their intersections. The bit lines can be selected via external bit addresses BADR and a corresponding column decoder BDEC, to which the bit addresses BADR are passed via address lines AL. The word lines are selected by external word addresses WADR via a line decoder WDEC.

Data to be read from the memory area M or to be written to it is passed to inputs/outputs I/O of the memory via two-way data lines DL. The data lines DL are routed via a switching unit S which contains three parallel branches for each data line DL.

The central branch and the right-hand branch of the switching unit S are used for writing data to the memory. The central branch has an inverting driver I and a first switch S1 connected in series. The right-hand branch has a first noninverting driver D1 and a second switch S2. The first switch S1 and the second switch S2 are never closed at the same time, as will be explained further below. The central branch and the right-hand branch are connected to a third switch S3, which is controlled by a write signal WE. The write signal WE has the effect that the third switch is closed during write access operations to the memory, and is otherwise open. This means that the setting of the first switch S1 and of the second switch S2 is of importance only when the third switch S3 is closed.

The left-hand branch of the switching unit S is used for reading data from the memory and has a second noninverting driver D2 and a fourth switch S4. The fourth switch S4 is closed during read access operations to the memory, depending on a read signal RE. The switches S1, S2, S3, S4 can be transistors or logic gates, for example.

In addition, the memory has a voltage regulator U, which produces an internal supply potential $V_{int}$ from the external supply potentials $V_{DD}$ and ground of the memory. The internal supply potential $V_{int}$ is lower in a first operating mode of the memory than in a second operating mode. A change between the two operating modes occurs depending on control signals at external connections 10 of the memory. The external connections 10 are connected to an operating mode recognition unit 11 that produces an operating mode signal MODE. A change of operating mode can occur, for example, as a result of a signal combination provided in a corresponding JEDEC standard being applied to the external connections 10. Some or all of the external connections 10 can match the inputs/outputs I/O or the address connections BADR, WADR. The operating mode signal MODE controls the voltage controller or regulator U.

The operating mode signal MODE is also used for controlling the first switch S1 and the second switch S2. It opens and closes these two switches S1, S2 alternately in each case. Whenever the operating mode signal MODE is at a low level, the switches S1, S2 are set as shown in FIG. 1, i.e. the first switch S1 is open (central branch of the switching unit S deactivated) and the second switch S2 is closed (right-hand branch activated). In contrast, if the operating mode signal MODE is at a high level, the first switch S1 is closed and the second switch S2 is open.

If the operating mode signal MODE is at a low level, the memory is in the first operating mode and data is transferred in uninverted form via the data lines DL both for reading (via the left-hand branch) and for writing (via the right-hand branch).

However, it the operating mode signal MODE is at a high level (second operating mode), the two switches S1, S2 change over, so that the central branch of the switching unit S is active. While data to be read continues to be transferred via the left-hand branch, data to be written is now transferred via the central branch of the switching unit S.

This means that, in the first operating mode, the switching unit S does not invert data being transferred via the data lines DL either for writing or for reading. In contrast, in the second operating mode, data is always written to the memory area M in inverted form via the inverter I, but is read again via the left-hand branch of the switching unit S, that is to say without inversion.

Consequently, if, for example, data having the logic state "1" are applied to the inputs/outputs I/O during a write operation and are written to some or all of the memory cells C in the memory area M, and these memory cells C are subsequently read again, then, in the first operating mode, data having the state logic "1" is in turn obtained at the inputs/outputs I/O, while, in the second operating mode, the read data has the state "0". By comparing the written data with that which has been read again, it is thus possible to use the existing external connections of the memory to recognize which operating mode it is in. If a large number of memory cells C are written to and read from in this manner, memory errors negligibly influence the result of the comparison.

In other illustrative embodiments of the invention, it is also possible for corresponding inversion by the switching unit S to be provided for only one or some of the data lines DL of the memory.

Figure 2:
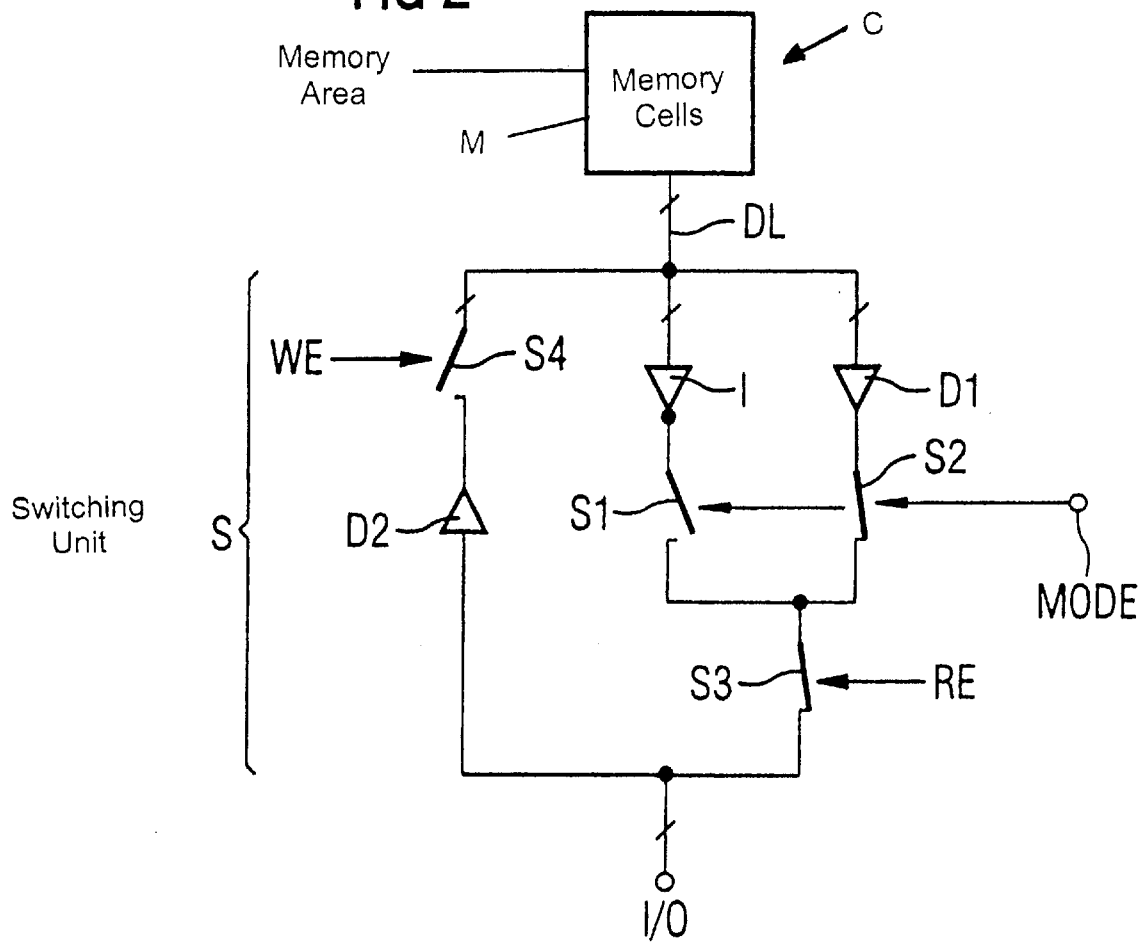
FIG. 2 shows a second illustrative embodiment of a digital memory.

FIG. 2 shows a second illustrative embodiment of the invention. The second embodiment differs from the first embodiment in FIG. 1 only in regard to it's switching unit S, which is why the remaining components have not been shown. This time, the central branch and the right-hand branch of the switching unit S are used for reading data from the memory. The third switch S3 is now controlled by the read signal RE. Accordingly, the left-hand branch of the switching unit S is used for writing data, with the fourth switch S4 being controlled by the write signal WE.

The memory shown in FIG. 2 operates similar to the memory shown in FIG. 1. Here too, the operating mode is checked by writing data having a particular logic state to the memory and then reading it. If the data is inverted when read, the memory is in the second operating mode, otherwise, it is in the first operating mode.

If, in the second operating mode, as for the illustrative embodiments explained here, the switching unit S inverts all of the data for writing or reading, the memory can in principle be tested in both operating modes. This is because the simple inversion carried out in the second operating mode does not affect the test. The operating mode is detected by comparing the written data with the data which is read again. The inversion which may have been carried out in the second operating mode can then be taken into account during evaluation of the test results.

Figure 3:
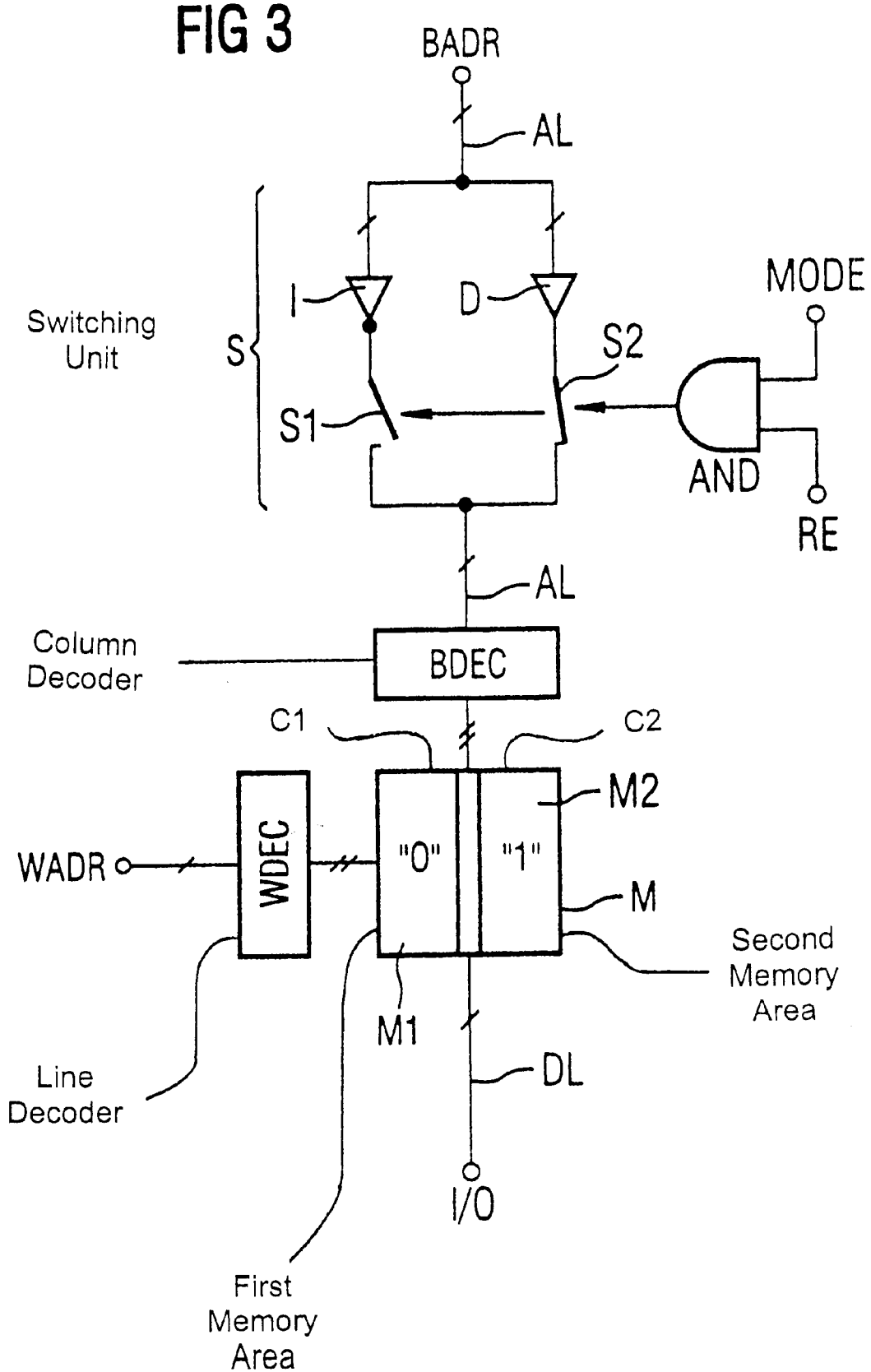
FIG. 3 shows a third illustrative embodiment of a digital memory.

FIG. 3 shows a third illustrative embodiment of the memory according to the invention. Components having the same reference symbols are the same as in the memories shown in FIGS. 1 and 2. Therefore, only the aspects that are different from those shown in FIG. 1 are dealt with below. In the memory shown in FIG. 3, the switching unit S does not invert the signals on the data lines DL, but rather inverts the bit addresses BADR on the address lines AL. This occurs only in the second operating mode and only during a read operation, as explained below.

The switching unit S has a left-hand branch with an inverting driver I and a first switch S1, and a right-hand branch with a noninverting driver D and a second switch S2. An AND gate AND is fed with the operating mode signal MODE and with the read signal RE, which is at a high level during a read operation of the memory and is otherwise at a low level. An output of the AND gate AND is connected to control inputs of the switches S1 and S2. If the memory shown in FIG. 3 is in the first operating mode, the operating mode signal is at a low level, and the switches S1 and S2 are set as shown. The same applies in the second operating mode (in which the operating mode signal MODE is at a high level) during a write operation, for which the read signal RE is at a low level. On the other hand, if a read access operation (read signal RE is at a high level) takes place in the second operating mode, the first switch S1 closes and the second switch S2 opens.

In other illustrative embodiments of the invention, the AND gate AND, shown in FIG. 3, can also be connected to the write signal WE, shown in FIG. 1, instead of to the read signal RE.

The addresses BADR are then inverted in the second operating mode only during write access operations to the memory.

The memory area M shown in FIG. 3 is split into a first memory area M1 and a second memory area M2. In order to be able to establish which operating mode the memory is in, logic zeros are written to the memory cells C1 of the first memory area M1, and logic ones are written to the memory cells C2 of the second memory area M2. In this case, the second switch S2 is closed and the first switch S1 is open. The memory areas M1, M2 are then read. In the first operating mode, in which the operating mode signal MODE is at a low level, the switches S1, S2 are set as shown in FIG. 3, irrespective of the read signal RE. The bit addresses BADR are therefore not inverted.

Since the read signal RE is at a high level for a read operation, then, in the second operating mode (operating mode signal MODE is at a high level), the setting of the switches S1 and S2 changes, for reading, from the state shown in FIG. 3, so that the first switch S1 is then closed and the second switch S2 is open. This means that the externally applied bit addresses BADR are passed to the column decoder BDEC in inverted form for reading, so that, instead of memory cells C1 of the first memory area M1, memory cells C2 of the second memory area M2 (and vice versa) are addressed in each case. Since both memory areas M1 and M2 store mutually complementary data, a comparison of the data written to the memory and read again via the inputs/outputs I/O of the memory can establish which of the two operating modes the memory is currently in.

In other illustrative embodiments of the invention, it is sufficient if, instead of all of the bits of the bit addresses BADR being inverted, as shown in FIG. 3, only one bit of the bit address BADR is inverted. Naturally, instead of the bit addresses BADR, the word addresses WADR or both address types can also be inverted accordingly.

In modifications of the illustrative embodiment shown in FIG. 3, the switching unit S can invert the addresses BADR both for writing and for reading in the first operating mode, and only for reading or only for writing in the second operating mode.

We claim:

1. A memory configuration, comprising:
a digital memory that includes:
memory cells;
at least one data line for writing data to said memory cells and for reading data from said memory cells;
address lines for addressing said memory cells; and
a switching unit having an active state in which said switching unit inverts a signal on a line selected from the group consisting of said data line and said address lines, said switching unit having an inactive state in which said switching unit leaves the signal unchanged, said active state and said inactive state defining states; said digital memory having a first operating mode, in which said switching unit is in the same one of said states for writing data to said memory cells and for reading data from said memory cells; and
said digital memory having a second operating mode, in which said switching unit is in one of said states for writing data to said memory cells and is in another one of said states for reading data from said memory cells.

2. A method of operating a digital memory, which comprises:
providing a digital memory with a first operating mode and a second operating mode;
while in the first operating mode, writing data to the digital memory using a first address;
while in the first operating mode, reading the data from the digital memory using the first address, the read data being in an unchanged logic state;
while in a second operating mode, writing data to the digital memory using a second address; and
while in the second operating mode, reading the data from the digital memory using the second address, the read data being in an inverted logic state.

3. The method according to claim 2, wherein:
while in the first operating mode, when performing the step of writing the data and when performing the step of reading the data, the same memory cells are addressed; and
while in the second operating mode, when performing the step of writing the data, different memory cells are addressed than the memory cells that are addressed when performing the step of reading the data.

4. The method according to claim 3, which comprises:
writing data having a first logic state to a first memory area of the digital memory using an address associated with the first memory area;
writing data having a second logic state to a second memory area of the digital memory; and
while in the second operating mode, reading data from the second memory area using the address associated with the first memory area.

* * * * *